United States Patent [19]
Aoki

[11] Patent Number: 5,150,326
[45] Date of Patent: Sep. 22, 1992

[54] REGISTER FILE CAPABLE OF HIGH SPEED READ OPERATION

[75] Inventor: Yasushi Aoki, Tokyo, Japan

[73] Assignee: NEC Corporation, Tokyo, Japan

[21] Appl. No.: 601,650

[22] Filed: Oct. 23, 1990

[30] Foreign Application Priority Data

Oct. 23, 1989 [JP] Japan .................. 1-276880

[51] Int. Cl.$^5$ .............................................. G11C 7/00
[52] U.S. Cl. .................. 365/189.01; 365/156
[58] Field of Search .......... 365/154, 156, 190, 189.01, 365/230.05

[56] References Cited

U.S. PATENT DOCUMENTS 4,873,665  10/1989  Jiang et al. .................. 365/154

*Primary Examiner*—Joseph A. Popek
*Attorney, Agent, or Firm*—Sughrue, Mion, Zinn Macpeak & Seas

[57] ABSTRACT

In a matrix array of registers, each register includes a latch having first and second terminals. First and second write transfer gates are responsive to a potential at a write address line for establishing a path from a first write data line to the first terminal of the latch and a path from a second write data line to the second terminal of the latch. A first junction is formed between series-connected N-channel MOS transistors whose gates are respectively coupled to the first and second terminals of the latch, and a second junction is likewise formed between series-connected N-channel MOS transistors whose gates are respectively coupled to the first and second terminals of the latch. First and second read transfer gates are respectively formed by N-channel MOS transistors which are responsive to a potential at a read address line for establishing a path from the first junction to a first read data line and a path from the second junction to a second read data line.

4 Claims, 3 Drawing Sheets

REGISTER FILE CAPABLE OF HIGH SPEED READ OPERATION

BACKGROUND OF THE INVENTION

The present invention relates generally to metal oxide semiconductor memories, and more specifically to a register file formed by a matrix array of registers.

A prior art register file comprises an array of registers which are respectively connected to associated read address line pairs, write address line pairs and read-write data line pairs. Each register includes P-channel metal oxide semiconductor (MOS) transistors at the output stage. Due to the slow operating characteristic of P-channel MOS transistors, the read time of the prior art register file is not satisfactory for high speed operations.

SUMMARY OF THE INVENTION

It is therefore an object of the present invention to provide a register file capable of operating with a short read time.

According to the present invention, there is provided a register file which comprises a plurality of address line pairs each comprising write and read address lines, and a plurality of write data line pairs each comprising first and second write data lines and a plurality of read data line pairs each comprising first and second read data lines. A matrix array of registers are associated respectively with the address line pairs and the write and read data line pairs. Each of the registers comprises a latch having first and second terminals, and a first write transfer gate responsive to a potential at the associated write address line for establishing a path between the associated first write data line and the first terminal of the latch. A second write transfer gate is responsive to said potential for establishing a path between the second terminal of the latch and the associated second write data line. A first pair of N-channel MOS transistors is provided having their drain-source paths connected in series between a voltage source and ground forming a first junction therebetween and having their gates respectively coupled to the first and second terminals of the latch. A second pair of N-channel MOS transistors is provided having their drain-source paths serially connected between the voltage source and ground forming a second junction therebetween and having their gates respectively coupled to the first and second terminals of the latch so that opposite potentials may develop across the first and second junctions corresponding to potentials at the first and second terminals of the latch. A first read transfer gate is formed by an N-channel MOS transistor which is responsive to a potential at the associated read address line for establishing a path between the associated first read data line and the first junction, and a second read transfer gate is formed by an N-channel MOS transistor which responds to the potential at the associated read address line by establishing a path between the associated second read data line and the second junction.

The latch comprises a first pair of complementary MOS transistors having their drain-source paths connected in series between the voltage source and ground forming the first terminal therebetween, and a second pair of complementary MOS transistors having their drain-source paths connected in series between the voltage source and ground forming the second terminal therebetween, the complementary transistors of the first pair having their gates coupled together to the second terminal of the latch and the complementary transistors of the second pair having their gates coupled together to the first terminal of the latch.

BRIEF DESCRIPTION OF THE DRAWINGS

The present invention will be described in further detail with reference to the accompanying drawings, in which.

DETAILED DESCRIPTION

Figure 1:
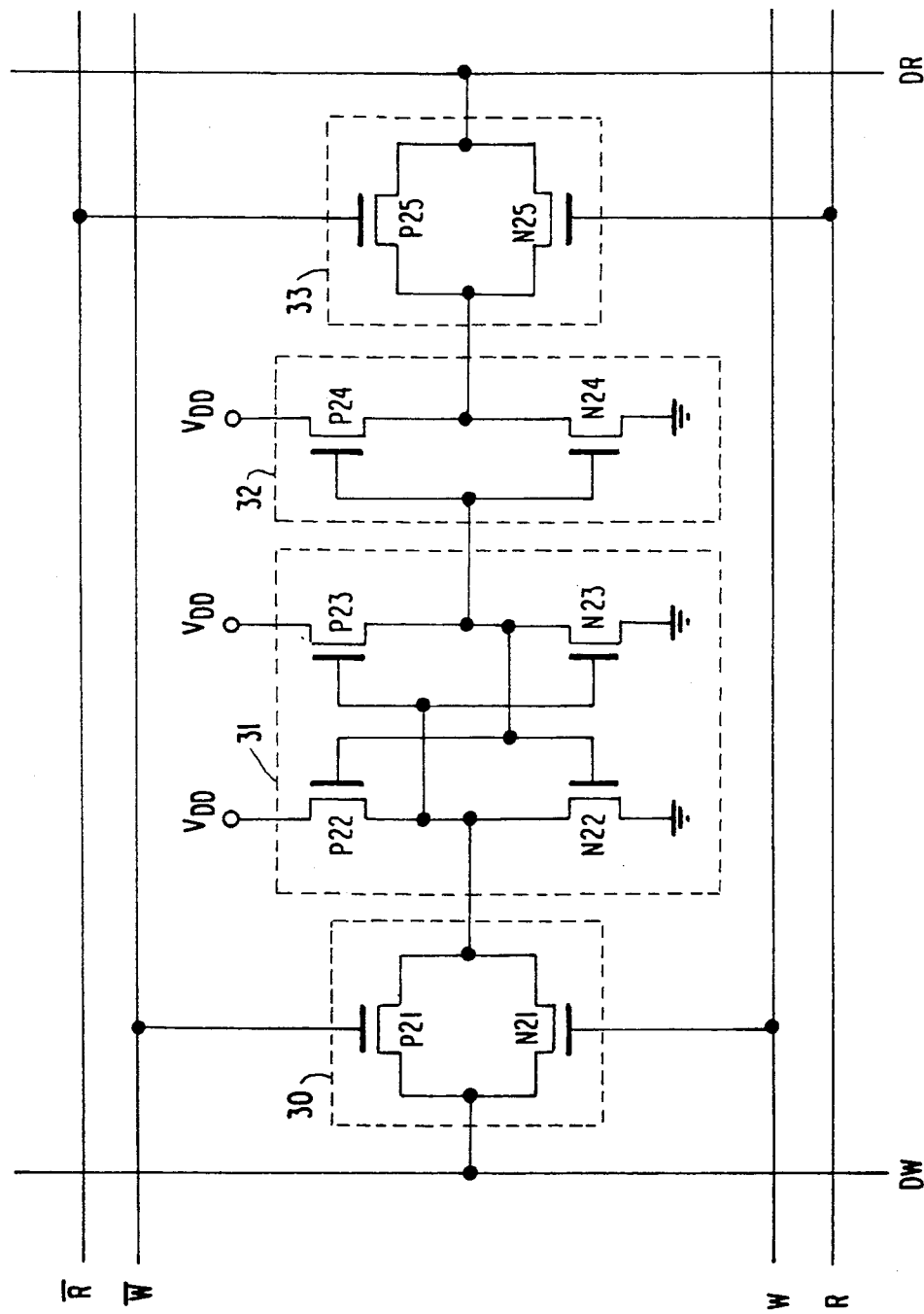
FIG. 1 is a circuit diagram of a prior art register.

Prior to the description of the present invention, it is appropriate to describe a prior art register with reference to FIG. 1. The prior art register is made up of a write transfer gate 30 formed by a P-channel metal oxide semiconductor (MOS) transistor P21 and an N-channel MOS transistor N21, with their gates being coupled respectively to write address lines $\overline{W}$ and W. When the write address line W is at "1", a bit on a write data line DW is passed through gate 30 to the input of a latch 31 formed by P-channel MOS transistors P22, P23 and N-channel MOS transistors N22, N23. The output of the latch 31 is coupled through an inverter 32, formed by P- and N-channel MOS transistors P24, N24, to the input of a read transfer gate 33 comprising a P-channel MOS transistor P25 and an N-channel MOS transistor N25. The gates of transistors P25, N25 are connected to read address lines $\overline{R}$ and R, respectively, to allow the bit stored in latch 31 to be applied to a read data line DR in response to a "1" at read address line R. When the logic state of read data line DR changes from "0" to "1", there is a current that flows from voltage source $V_{DD}$ through transistors P24 and P25 to line DR, charging its stray capacitance. As a result, the rise time of line DR depends on the degree of ease with which the current flows through transistors P24, P25. Since P-channel MOS transistors have a lower operating speed than N-channel MOS transistors, the rise time of the prior art register during read data cycle is not satisfactory for high speed operations.

Figure 2:
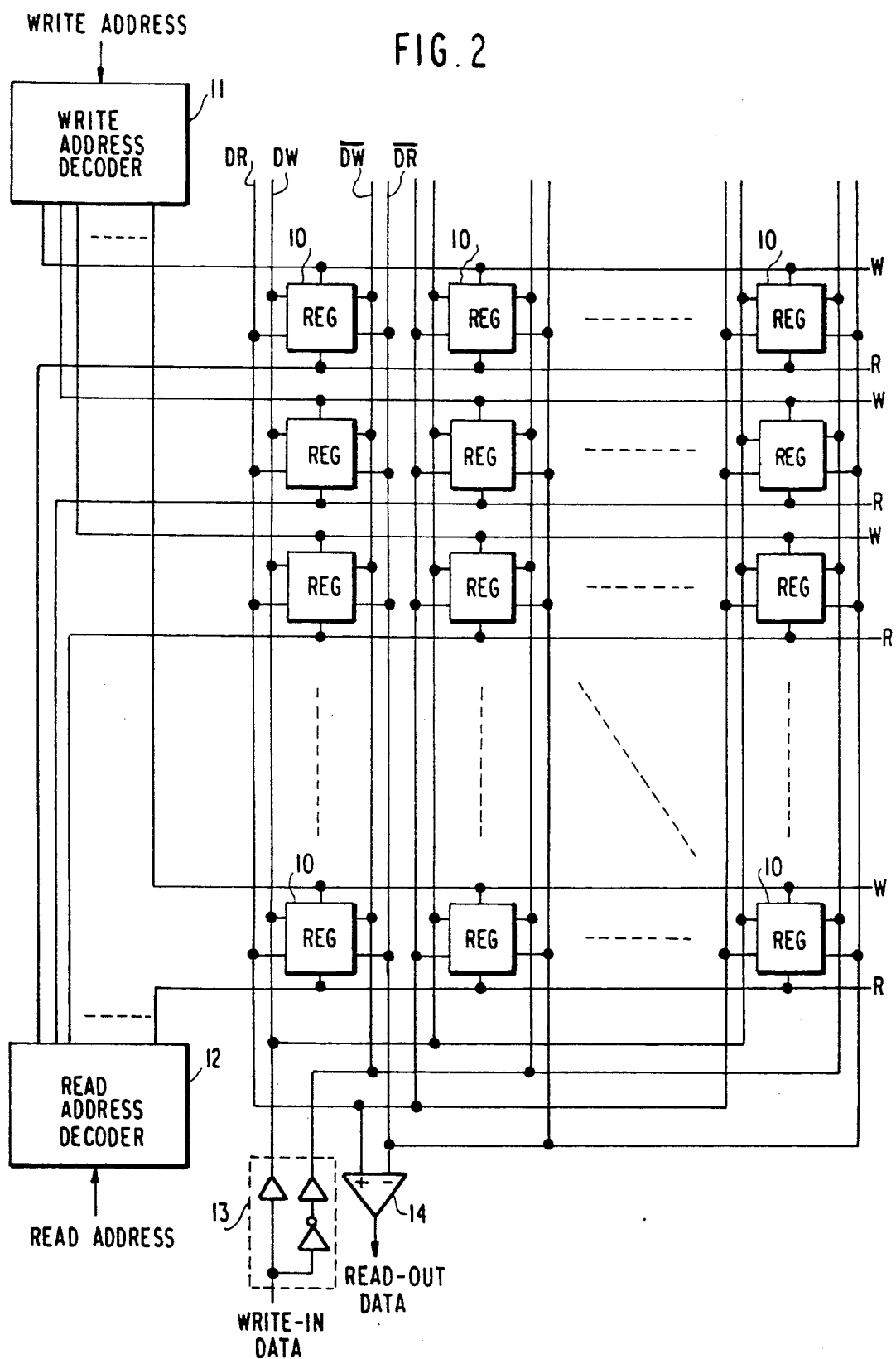
FIG. 2 is a block diagram of a register file according to the present invention.

Referring now to FIG. 2, a register file of the present invention is shown as comprising a plurality of registers 10 arranged in a matrix of rows and columns. Those registers arranged rowwise are connected to common read/write address lines R and W and those arranged columnwise are connected to common read/write data lines DR, DW, $\overline{DW}$ and $\overline{DR}$. All write address lines W are connected to a write address decoder 11 to which a write address code is supplied and all read address lines R are connected to a read address decoder 12 to which a read address code is supplied. Write-in data is supplied to a write buffer 13 in which it is converted to a pair of amplified, mutually opposite potential data signals, which are applied respectively to all write data lines DW and $\overline{DW}$. Data read out of each register 10 are supplied to read data lines DR and $\overline{DR}$ which are in turn connected to the inputs of a read-out comparator 14.

Figure 3:
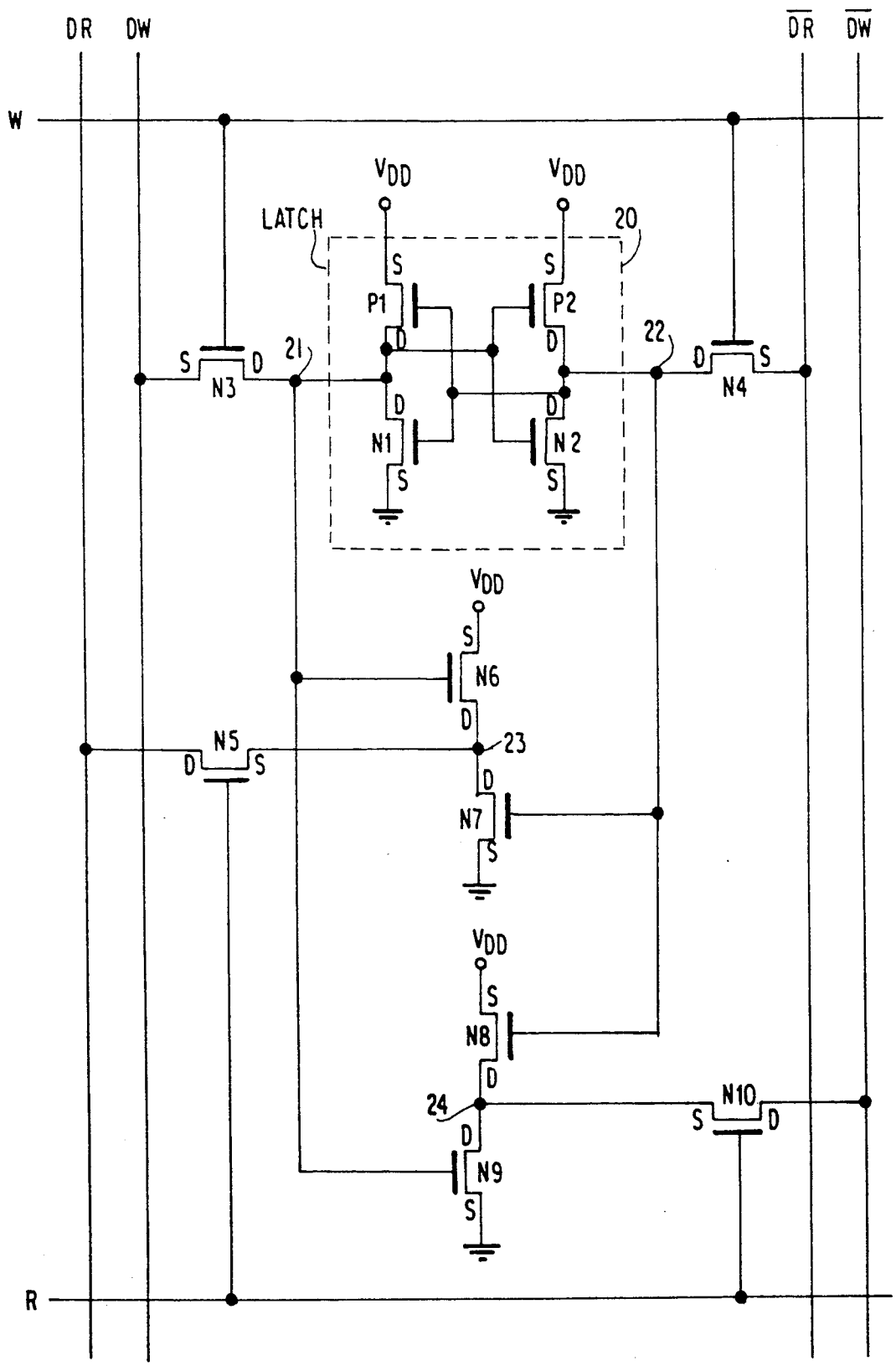
FIG. 3 is an illustration of details of each register of FIG. 1.

As illustrated in FIG. 3, each register comprises a latch 20 formed by a pair of first MOS transistors of opposite conductivity channels designated P1 and N1 and a pair of second MOS transistors of opposite conductivity channels P2 and N2, the transistors of each pair being connected in series between a voltage source $V_{DD}$ and ground such that the source of P-channel MOS transistor P1 and P2 are connected to voltage source $V_{DD}$ and the source of N-channel MOS transistors N1 and N2 are connected to ground. The drains of transistors P1 and N1 are connected together at a junction 21 to the gates of transistors P2 and N2, while the drains of transistors P2 and N2 are connected together at a junction 22 to the gates of transistors P1 and N1. Junctions 21 and 22 respectively form the first and second terminals of latch 20.

The write data line DW associated with the register is connected to the source of an N-channel MOS transistor N3 whose drain is connected to junction 21 to which the drains of complementary MOS transistors P1 and N1 and the gates of N-channel MOS transistors N6 and N9 are connected. Likewise, the associated write data line $\overline{DW}$ is connected to the source of an N-channel MOS transistor N4 whose drain is connected to junction 22 to which the drains of transistors P2 and N2 and the gates of N-channel MOS transistors N7 and N8 are connected. The source of transistor N6 is connected to voltage source $V_{DD}$ and its drain is connected at a junction 23 to the drain of transistor N7 whose source is connected to ground. Likewise, the source of transistor N8 is connected to voltage source $V_{DD}$ and its drain is connected at a junction 24 to the drain of transistor N9 whose source is connected to ground. Each of the transistors N3 and N4 serves as transfer gates for transfer of bits from the write address line W to the terminals of the latch 20, respectively.

The read data line DR associated with the register is connected to the drain of an N-channel MOS transistor N5 whose source is connected to junction 23. Similarly, the associated read data line $\overline{DR}$ is connected to the drain of an N-channel MOS transistor N10 whose source is connected to junction 24. Transistors N5 and N10 serve as transfer gates for transfer of stored bits from the junctions 23 and 24 to the read address line R, respectively.

Each write address line W is connected to the gates of transistors N3 and N4 and each read address line R is connected to the gates of transistors N5 and N10.

The operation of the register is as follows. When the write address line W is "1", transistors N3 and N4 are turned on, allowing input potentials on lines DW and $\overline{DW}$ to be stored into latch 20. A "0" on the write address line W holds the data bit stored in latch 20, so that opposite voltages respectively appear at junctions 21 and 22 corresponding to the logic level of a bit stored in the latch, and voltages corresponding to those appearing at junctions 21 and 22 appear at the gates of transistors N6 and N9 and at those of transistors N7 and N8. Therefore, transistors N6 and N7 are rendered conductive during mutually exclusive times, and likewise, transistors N8 and N9 are rendered conductive during mutually exclusive times.

When the read address line R switches from "0" to "1", transistors N5 and N10 are turned on, coupling the junctions 23 and 24 to read data lines DR and $\overline{DR}$, respectively. If junction 21 is at "1", and hence junction 22 is at "0", transistors N6 and N9 are turned on, while causing transistors N7 and N8 are turned off. As a result, the turn-on of transistors N5 and N10 causes "1" and "0" to appear at read data lines DR and $\overline{DR}$, respectively. It is seen that, with read address line R being at "1", "0" and "1" at junctions 21 and 22 cause "0" and "1" to respectively appear at lines DR and $\overline{DR}$.

The fall time of voltages at read data line DR is determined by the degree of ease with which the current flows through transistors N5 and N7, and similarly, the fall time of voltages at read data line $\overline{DR}$ is determined by the degree of ease with which the current flows through transistors N9 and N10. Because of the high-speed operating speed of the N-channel MOS characteristic, transistors N5, N7, N9 and N10 provide high speed operations during read cycles. Data read times can therefore be reduced significantly in comparison with the prior art of FIG. 1.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A register file comprising:
   a plurality of address line pairs each comprising write and read address lines;
   a plurality of write data line pairs each comprising first and second write data lines and a plurality of read data line pairs each comprising first and second read data lines; and
   a matrix array of registers associated respectively with said address line pairs and said write and read data line pairs, each of said registers comprising:
   a latch having first and second terminals;
   a first write transfer gate responsive to a potential at the associated write address line for establishing a path between the associated first write data line and the first terminal of said latch and a second write transfer gate responsive to said potential for establishing a path between the second terminal of said latch and the associated second write data line;
   a first pair of N-channel metal oxide semiconductor (MOS) transistors having drain-source paths connected in series between a voltage source and ground forming a first junction therebetween and having gates respectively coupled to said first and second terminals of said latch;
   a second pair of N-channel MOS transistors having drain-source paths connected in series between the voltage source and ground forming a second junction therebetween and having gates respectively coupled to said first and second terminals of said latch so that opposite potentials may develop across said first and second junctions corresponding to potentials developed at said first and second terminals of the latch; and
   a first read transfer gate formed by an N-channel MOS transistor responsive to a potential at the associated read address line for establishing a path between the associated first read data line and said first junction, and a second read transfer gate formed by an N-channel MOS transistor responsive to said potential at said associated read address line for establishing a path between the associated second read data line and said second junction.

2. A register file as claimed in claim 1, wherein said latch comprises a first pair of complementary MOS transistors having drain-source paths connected in series between the voltage source and ground forming said first terminal therebetween, and a second pair of complementary MOS transistors having drain-source paths connected in series between the voltage source and ground forming said second terminal therebetween, the complementary transistors of said first pair having gates coupled together to the second terminal of said latch and the complementary transistors of said second pair having gates coupled together to the first terminal of said latch.

3. A register file as claimed in claim 1, wherein said first write transfer gate comprises an N-channel MOS transistor having a drain-source path coupled between the associated first write data line and said first terminal of said latch and having a gate coupled to the associated write address line, and said second write transfer gate comprises an N-channel MOS transistor having a drain-source path coupled between the associated second write data line and said second terminal of said latch and having a gate coupled to the associated write address line.

4. A register file as claimed in claim 2, wherein said first write transfer gate comprises an N-channel MOS transistor having a drain-source path coupled between the associated first write data line and said first terminal of said latch and having a gate coupled to the associated write address line, and said second write transfer gate comprises an N-channel MOS transistor having a drain-source path coupled between the associated second write data line and second terminal of said latch, and having a gate coupled to the associated write address line.

* * * * *